United States Patent
Miyoshi

(10) Patent No.: US 10,692,743 B2
(45) Date of Patent: Jun. 23, 2020

(54) METHOD OF INSPECTING GAS SUPPLY SYSTEM

(71) Applicant: TOKYO ELECTRON LIMITED, Tokyo (JP)

(72) Inventor: Risako Miyoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 191 days.

(21) Appl. No.: 16/010,528

(22) Filed: Jun. 18, 2018

(65) Prior Publication Data

US 2018/0374726 A1    Dec. 27, 2018

(30) Foreign Application Priority Data

Jun. 23, 2017    (JP) .................. 2017-122876

(51) Int. Cl.
   *H01L 21/67* (2006.01)
   *G05D 11/13* (2006.01)
   (Continued)

(52) U.S. Cl.
   CPC ........ *H01L 21/67253* (2013.01); *G05D 11/13* (2013.01); *H01J 37/32449* (2013.01); *H01J 37/32715* (2013.01); *H01J 37/32834* (2013.01); *H01L 21/67017* (2013.01); *H01L 21/67069* (2013.01); *H01L 21/67109* (2013.01); *H01L 21/67248* (2013.01); *H01L 21/6831* (2013.01); *G05D 16/2053* (2013.01); *H01J 2237/334* (2013.01); *Y10T 137/2544* (2015.04);
   (Continued)

(58) Field of Classification Search
   CPC ...... Y10T 137/2544; Y10T 137/87169; G05D 16/2053; G05D 11/13; A61B 5/112; H01L 21/67253; H01L 21/67017; H01L 21/67069; H01L 21/67109; H01L 21/67248; H01L 21/6831; H01J 37/32091; H01J 37/32449; H01J 37/32715; H01J 37/32834; H01J 2237/334
   USPC ........................................ 137/102, 596, 606
   See application file for complete search history.

(56) References Cited

U.S. PATENT DOCUMENTS

| 7,979,165 B2 * | 7/2011 | Gotoh ............... G01F 1/6847 137/2 |
| 8,048,687 B2 * | 11/2011 | Shimizu ............. H01L 21/3105 438/4 |

(Continued)

FOREIGN PATENT DOCUMENTS

JP    2003-160870 A    6/2003

*Primary Examiner* — William M McCalister
(74) *Attorney, Agent, or Firm* — Studebaker & Brackett PC

(57) ABSTRACT

In one embodiment, a gas supply line is connected to a chamber of a substrate processing apparatus. A vaporizer is connected to the gas supply line. A flow rate controller is connected to the gas supply line in parallel with the vaporizer through a secondary valve. A primary valve is provided on a primary side of the flow rate controller. A method of the embodiment includes supplying a processing gas to the chamber from the vaporizer through the gas supply line in a state in which the primary valve is closed, the secondary valve is opened, and an exhaust device is operated to set a pressure of the chamber to a predetermined pressure and determining a time-average value of a measurement value obtained by a pressure sensor of the flow rate controller while the supplying the processing gas is performed.

11 Claims, 6 Drawing Sheets

(51) Int. Cl.
  *G05D 16/20* (2006.01)
  *H01J 37/32* (2006.01)
  *H01L 21/683* (2006.01)

(52) U.S. Cl.
  CPC .................. *Y10T 137/87169* (2015.04); *Y10T 137/87684* (2015.04)

(56) References Cited

U.S. PATENT DOCUMENTS

| | | | | |
|---|---|---|---|---|
| 8,205,629 | B2* | 6/2012 | Gregor | G01F 25/003 137/2 |
| 8,357,615 | B2* | 1/2013 | Chiba | H01J 37/32522 216/58 |
| 8,770,215 | B1* | 7/2014 | Mudd | F17D 3/01 137/12 |
| 9,556,518 | B2* | 1/2017 | Nagase | C23C 16/448 |
| 9,631,777 | B2* | 4/2017 | Nagase | C23C 16/4482 |
| 10,168,049 | B2* | 1/2019 | Amikura | F23N 5/24 |
| 10,386,861 | B2* | 8/2019 | Hirata | G01F 1/6965 |
| 2012/0031266 | A1* | 2/2012 | Amikura | B01D 53/30 95/19 |
| 2013/0092269 | A1* | 4/2013 | Nakada | G01F 1/00 137/613 |
| 2013/0137279 | A1* | 5/2013 | Yamamoto | H01L 21/02225 438/778 |
| 2014/0083514 | A1* | 3/2014 | Ding | G05D 7/0647 137/12 |
| 2016/0281223 | A1* | 9/2016 | Sowa | C23C 16/45544 |
| 2016/0284542 | A1* | 9/2016 | Noda | H01L 21/02274 |
| 2017/0011908 | A1* | 1/2017 | Matsuoka | C23C 16/45531 |
| 2018/0204742 | A1* | 7/2018 | Tateno | H01L 21/67017 |
| 2018/0286727 | A1* | 10/2018 | Ohashi | H01L 21/6838 |
| 2018/0374726 | A1* | 12/2018 | Miyoshi | H01L 21/67253 |
| 2018/0374727 | A1* | 12/2018 | Miyoshi | H01L 21/67253 |
| 2018/0374734 | A1* | 12/2018 | Hirano | C23C 16/458 |

* cited by examiner

METHOD OF INSPECTING GAS SUPPLY SYSTEM

CROSS-REFERENCE TO RELATED APPLICATIONS

This application is based on and claims the benefit of priority from Japanese Patent Application No. 2017-122876 filed on Jun. 23, 2017, the entire contents of which are incorporated herein by reference.

FIELD

Exemplary embodiments of the present disclosure relate to a method of inspecting a gas supply system.

BACKGROUND

In manufacturing an electronic device, a substrate processing apparatus such as a plasma processing apparatus is used for processing a substrate. In general, the substrate processing apparatus includes a chamber body and a gas supply system. The chamber body provides an internal space as a chamber. The gas supply system supplies a gas to the chamber.

As the substrate processing apparatus, Japanese Patent Application Laid-Open Publication No. 2003-160870 describes a plasma processing apparatus including a gas supply system having a vaporizer. The vaporizer generates a processing gas by vaporizing a liquid. The processing gas generated by the vaporizer is supplied to the chamber through a gas supply line.

SUMMARY

According to an aspect, there is provided a method of inspecting a gas supply system of a substrate processing apparatus. The substrate processing apparatus includes a chamber body, the gas supply system, and an exhaust device. The chamber body provides an internal space as a chamber. The gas supply system is configured to supply a gas to the chamber. The exhaust device is connected to the chamber. The gas supply system has a first gas supply unit. The first gas supply unit has a pipe, a vaporizer, a first primary valve, a first secondary valve, and a first flow rate controller. The pipe provides a first gas supply line. The first gas supply line is connected to the chamber. The vaporizer is configured to generate a first processing gas by vaporizing a liquid. The vaporizer is connected to the first gas supply line. The first flow rate controller is connected to a source of a first inert gas through the first primary valve, and is connected to the first gas supply line through the first secondary valve. The first flow rate controller has one or two first pressure sensors. The one or two first pressure sensors are configured to obtain a measurement value of a pressure of a flow passage within the first flow rate controller. The method according to the aspect includes supplying the first processing gas to the chamber from the vaporizer through the first gas supply line in a state in which the first primary valve is closed, the first secondary valve is opened, and the exhaust device is operated to set a pressure of the chamber to a predetermined pressure, and determining a time-average value of the measurement value obtained by the one or two first pressure sensors while the supplying the first processing gas is performed.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
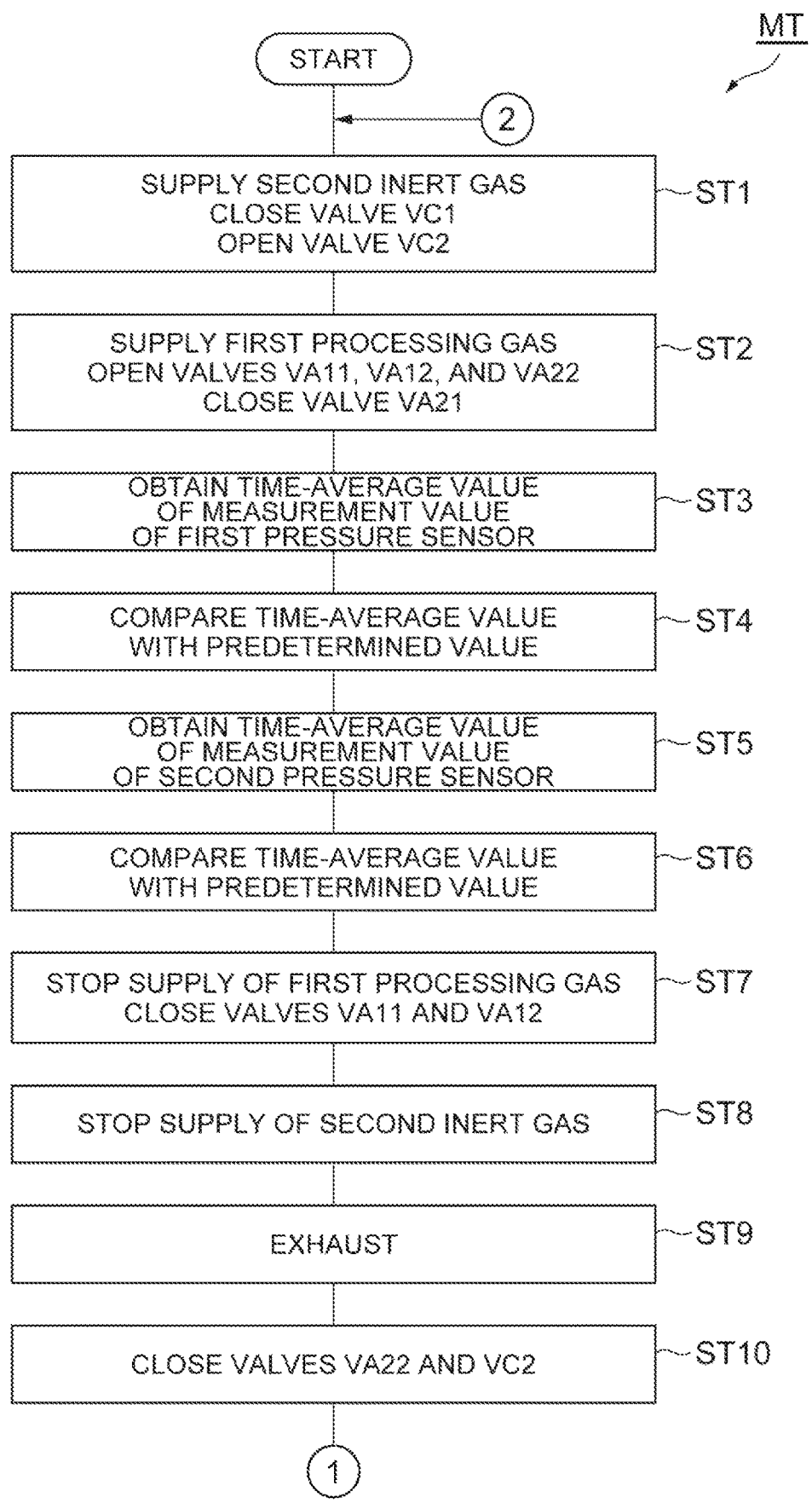
FIG. 1 is a flowchart illustrating a method of inspecting a gas supply system according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The processing gas generated by the vaporizer may react within the gas supply line to generate a solid. In a case where the processing gas reacts to generate the solid within the gas supply line, a sectional area of the gas supply line is decreased. As a result, the responsiveness of the processing gas supplied to the chamber is changed. The change in responsiveness of the processing gas supplied to the chamber influences a processing result of the substrate. Accordingly, there is a need for inspection of the gas supply system having the vaporizer.

According to an aspect, there is provided a method of inspecting a gas supply system of a substrate processing apparatus. The substrate processing apparatus includes a chamber body, the gas supply system, and an exhaust device. The chamber body provides an internal space as a chamber. The gas supply system is configured to supply a gas to the chamber. The exhaust device is connected to the chamber. The gas supply system has a first gas supply unit. The first gas supply unit has a pipe, a vaporizer, a first primary valve, a first secondary valve, and a first flow rate controller. The pipe provides a first gas supply line. The first gas supply line is connected to the chamber. The vaporizer is configured to generate a first processing gas by vaporizing a liquid. The vaporizer is connected to the first gas supply line. The first flow rate controller is connected to a source of a first inert gas through the first primary valve, and is connected to the first gas supply line through the first secondary valve. The first flow rate controller has one or two first pressure sensors. The one or two first pressure sensors are configured to obtain a measurement value of a pressure of a flow passage within the first flow rate controller. The method according to the aspect includes supplying the first processing gas to the chamber from the vaporizer through the first gas supply line in a state in which the first primary valve is closed, the first secondary valve is opened, and the exhaust device is operated to set a pressure of the chamber to a predetermined pressure, and determining a time-average value of the measurement value obtained by the one or two first pressure sensors while the supplying the first processing gas is performed.

In the method according to the aspect, the first processing gas from the vaporizer is supplied to the chamber. The first processing gas is also supplied to the flow passage within the first flow rate controller. In the first flow rate controller, the measurement value of the pressure of the flow passage is obtained by the one or two first pressure sensors. In this method, the time-average value of the measurement value is determined. In a case where the first processing gas reacts within the first gas supply line to generate a solid, the sectional area of the first gas supply line is decreased, and the time-average value of the measurement value of the pressure of the flow passage within the first flow rate controller is increased. That is, the time-average value reflects a change in the sectional area of the first gas supply line caused by the reaction of the first processing gas. In accordance with the method according to the aspect, since such a time-average value is determined, it is possible to inspect the gas supply system for a state of the first gas supply line.

In one embodiment, the method further includes comparing the time-average value with a predetermined value. According to the embodiment, in a case where the time-average value is greater than the predetermined value, it is possible to detect that the sectional area of the first gas supply line is decreased due to the generation of the solid caused by the reaction of the first processing gas.

In one embodiment, the shortest length of the flow passage between each of the open ends of the plurality of gas delivery outlets through which the first processing gas is delivered to the chamber and each of one or two first pressure sensors is equal to or less than 1.5 m. According to the embodiment, it is possible to detect a change in the pressure caused by the reduction of the sectional area of the first gas supply line with high sensitivity by using the one or two first pressure sensors.

In one embodiment, the first flow rate controller further has a first control valve and a first orifice member, and has two first pressure sensors as the one or two first pressure sensors. One of the two first pressure sensors is configured to obtain a measurement value of a pressure of a flow passage between the first control valve and the first orifice member. The other one of the two first pressure sensors is configured to obtain a measurement value of a pressure of a flow passage on a secondary side of the first orifice member. The time-average value obtained in the embodiment is a time-average value of measurement values of pressures obtained by the two first pressure sensors. Therefore, according to the embodiment, it is possible to a value that reflects the change in the sectional area of the first gas supply line with high accuracy.

In one embodiment, the substrate processing apparatus further includes a second gas supply unit, a plurality of pipes, and a flow splitter. The second gas supply unit is configured to supply a second processing gas and a second inert gas. The plurality of pipes respectively provides a plurality of gas supply lines connected to the chamber. The plurality of gas supply lines includes a second gas supply line and a third gas supply line. The flow splitter is configured to distribute a gas supplied from the second gas supply unit to the plurality of gas supply lines. The first gas supply line is connected to the chamber through the second gas supply line. In the embodiment, the method further includes supplying the second inert gas to the plurality of gas supply lines from the second gas supply unit through the flow splitter. The supplying the first processing gas is performed while the supplying the second inert gas is performed. According to the embodiment, the first processing gas is prevented from flowing to the flow splitter through the plurality of pipes.

In one embodiment, the method of inspecting a gas supply system further includes supplying the first inert gas to the first gas supply line in a state in which supply of the first processing gas to the first gas supply line from the vaporizer is stopped, and supplying the second processing gas to the chamber from the second gas supply unit through the flow splitter and the plurality of gas supply lines while the supplying the first inert gas is performed. According to the embodiment, the second processing gas is prevented from flowing to the first gas supply line in a case where the second processing gas is supplied to the chamber.

In one embodiment, the substrate processing apparatus is a plasma processing apparatus. In the embodiment, the method is performed in a state in which a substrate is mounted on a stage provided within the chamber. Particles of the first processing gas are deposited on the substrate and/or within the substrate in the supplying the first processing gas. Plasma of the second processing gas is generated within the chamber to etch the substrate while the supplying the second processing gas is performed. That is, in the embodiment, the gas supply system is inspected while a process including the depositing of the particles composing the first processing gas on the substrate and/or within the substrate and the etching of the substrate is performed.

In one embodiment, the supplying the first processing gas and the supplying the second processing gas may be alternately performed. In the embodiment, the depositing of the particles composing the first processing gas on the substrate and/or within the substrate and the etching of the substrate are alternately performed.

In one embodiment, the substrate processing apparatus further includes a second flow rate controller, a second secondary valve provided on a primary side of the second flow rate controller, and a second primary valve provided on a secondary side of the second flow rate controller. The second flow rate controller has one or two second pressure sensors configured to obtain a measurement value of a pressure of a flow passage within the second flow rate controller. The second flow rate controller is connected to the third gas supply line through the second secondary valve. In the embodiment, the method further includes determining a time-average value of the measurement value obtained by the one or two second pressure sensors in a state in which the second primary valve is closed and the second secondary valve is opened while the supplying the second inert gas is performed. In the embodiment, during supply of the second inert gas, the second inert gas is also supplied to the flow passage within the second flow rate controller. In the embodiment, a measurement value of a pressure of a flow passage within the second flow rate controller is obtained by one or two second pressure sensors in a state in which the second inert gas is supplied into the second flow rate controller, and a time-average value of the measurement value is determined. The time-average value reflects a change in the sectional area of the third gas supply line. Accordingly, it is possible to inspect the third gas supply line according to the embodiment.

In one embodiment, the method further includes determining a time-average value of the measurement value obtained by the one or two second pressure sensors in a state in which the second primary valve is closed and the second secondary valve is opened while the supplying the second processing gas is performed. In the embodiment, during supply of the second inert gas, the second processing gas is also supplied to the flow passage within the second flow rate controller. In the embodiment, a measurement value of the pressure of the flow passage within the second flow rate controller is obtained by the one or two second pressure sensors in a state in which the second processing gas is supplied into the second flow rate controller, and a time-average value of the measurement value is determined. The time-average value reflects a change in the sectional area of the third gas supply line. Accordingly, it is possible to inspect the third gas supply line according to the embodiment.

In one embodiment, the second flow rate controller further has a second control valve and a second orifice member, and has two second pressure sensors as the one or two second pressure sensors. One of the two second pressure sensors is configured to obtain a measurement value of a pressure of a flow passage between the second control valve and the second orifice member. The other one of the two second pressure sensors is configured to obtain a measurement value of a pressure of a flow passage on a secondary side of the second orifice member. The time-average value obtained in the embodiment is a time-average value of measurement values obtained by the two second pressure sensors. Therefore, according to the embodiment, it is possible to obtain a value that reflects a change in the sectional area of the third gas supply line with high accuracy.

Hereinafter, various embodiments will be described in detail with reference to the drawings. In the drawing, the same or equivalent portions are denoted by the same reference symbols.

Figure 2:
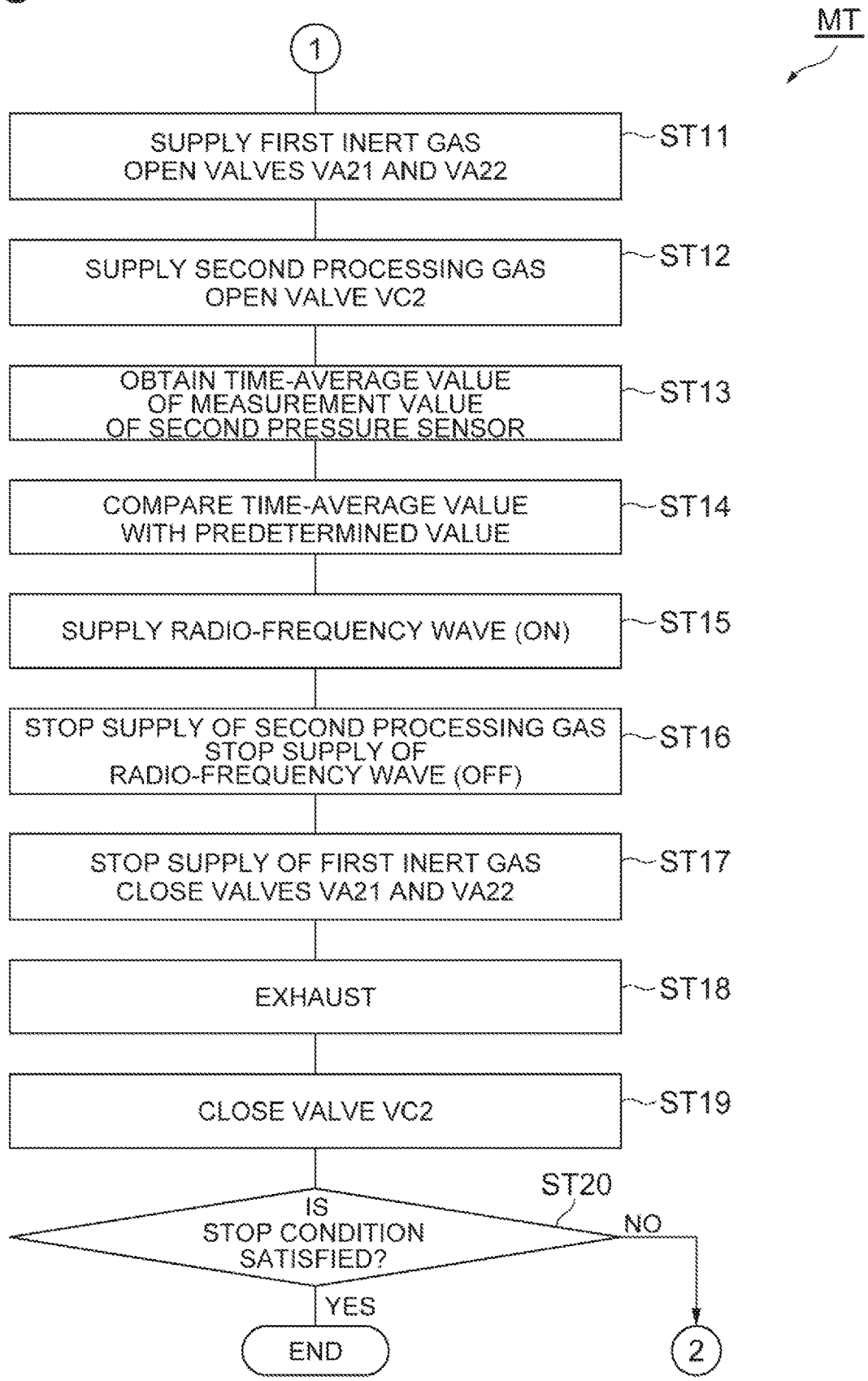
FIG. 2 is a flowchart illustrating a method of inspecting the gas supply system according to an exemplary embodiment.
Figure 3:
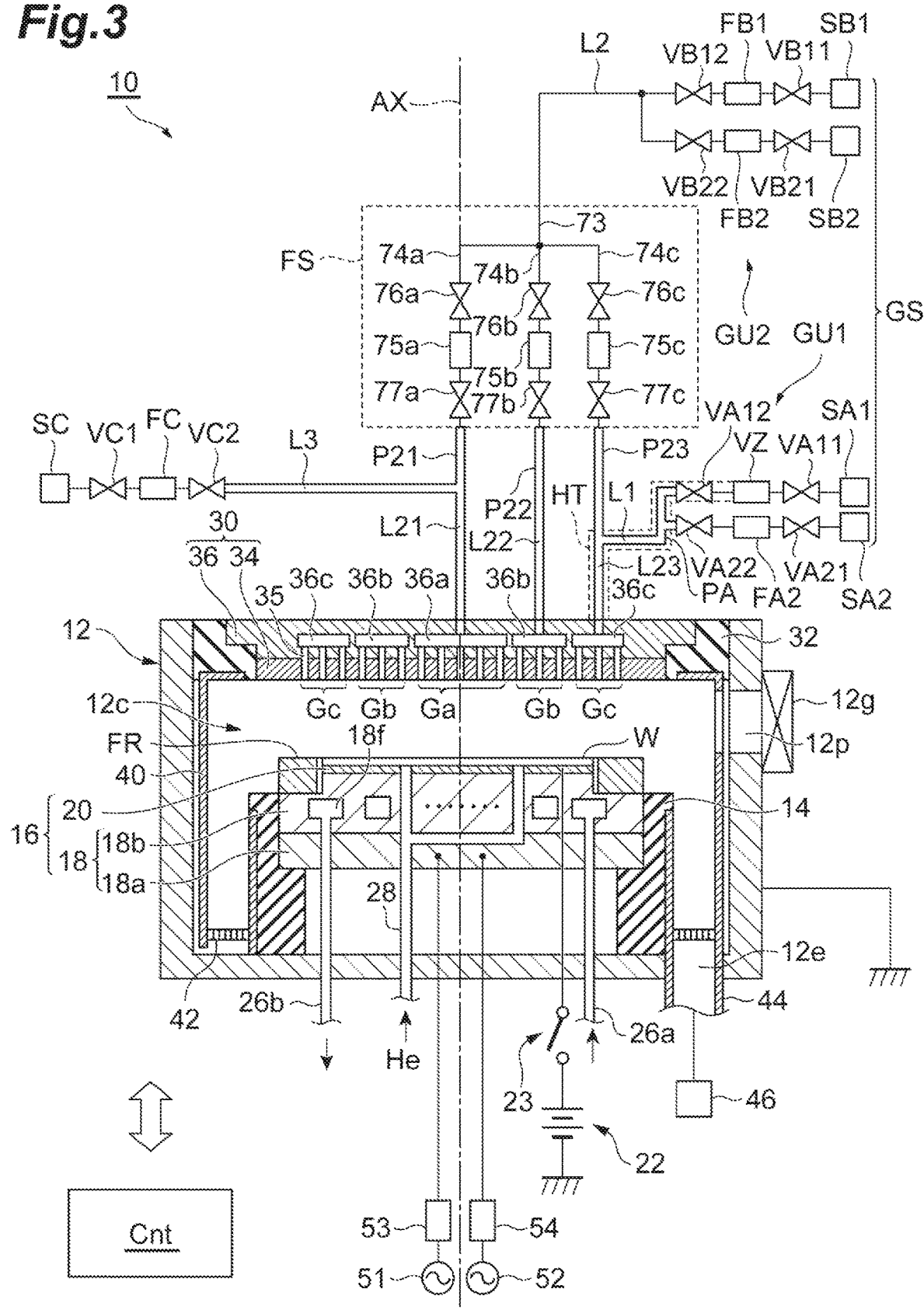
FIG. 3 schematically illustrates a plasma processing apparatus which is a substrate processing apparatus according to an exemplary embodiment.

FIGS. 1 and 2 are flowcharts illustrating a method of inspecting the gas supply system according to an exemplary embodiment. The method MT shown in FIGS. 1 and 2 is performed in order to inspect a gas supply system of a substrate processing apparatus. FIG. 3 schematically illustrates a plasma processing apparatus which is the substrate processing apparatus according to an exemplary embodiment. A plasma processing apparatus 10 according to the embodiment shown in FIG. 3 is a capacitively coupled plasma processing apparatus.

The plasma processing apparatus 10 includes a chamber body 12. The chamber body 12 has a substantially cylindrical shape. A central axis line of the chamber body 12 substantially coincides with an axis AX that extends in a vertical direction. The chamber body 12 provides an internal space thereof as a chamber 12c. The chamber body 12 is formed of, for example, aluminum. An anodizing process is performed on an inner wall surface of the chamber body 12. The chamber body 12 is grounded. A passageway 12p is formed in a sidewall of the chamber body 12. When a substrate W is transferred in the chamber 12c and is transferred out from the chamber 12c, the substrate passes through the passageway 12p. The substrate W may have a substantially disc shape such as a wafer. A gate valve 12g is provided along the sidewall of the chamber body 12 in order to open or close the passageway 12p.

A support 14 is provided on a bottom of the chamber body 12. The support 14 is formed of, for example, an insulating material. The support 14 has a substantially cylindrical shape. The support 14 extends from the bottom of the chamber body 12 in the vertical direction within the chamber 12c. A stage 16 is provided within the chamber 12c. The stage 16 is supported by a support 14.

The stage 16 supports the substrate W on a top surface thereof. The stage 16 has a lower electrode 18 and an electrostatic chuck 20. The lower electrode 18 includes a first plate 18a and a second plate 18b. The first plate 18a and the second plate 18b are formed of, for example, metal such as aluminum, and have substantially disc shapes. The second plate 18b is provided on the first plate 18a, and is electrically connected to the first plate 18a.

The electrostatic chuck 20 is provided on the second plate 18b. The electrostatic chuck 20 has an insulation layer and an electrode which is a conductive film embedded in the insulating film. A direct current power supply 22 is electrically connected to the electrode of the electrostatic chuck 20 through a switch 23. The substrate W is mounted on the electrostatic chuck 20. When a voltage from the direct current power supply 22 is applied to the electrode of the electrostatic chuck 20, electrostatic attractive force is generated between the electrostatic chuck 20 and the substrate W. The substrate W is attracted to the electrostatic chuck 20 due to the generated electrostatic attractive force. Accordingly, the substrate W is held by the electrostatic chuck 20.

A focus ring FR is disposed on a peripheral portion of the second plate 18b so as to surround an edge of the substrate W. The focus ring FR is provided in order to improve uniformity in plasma processing. For example, the focus ring FR may be made of a material such as silicon, quartz, or SiC.

A flow passage 18f is formed in the second plate 18b. A coolant is supplied to the flow passage 18f through a pipe 26a from a chiller unit provided outside the chamber body 12. The coolant supplied to the flow passage 18f is returned to the chiller unit through a pipe 26b. A temperature of the coolant to be supplied to the flow passage 18f is controlled, and thus, a temperature of the substrate W mounted on the electrostatic chuck 20 is controlled.

A gas supply line 28 is provided in the plasma processing apparatus 10. The gas supply line 28 supplies a heat transfer gas from a heat transfer gas supply mechanism, for example, a He gas between a top surface of the electrostatic chuck 20 and a rear surface of the substrate W.

The plasma processing apparatus 10 further includes a gas delivery portion 30. The gas delivery portion 30 is configured to deliver the gas to the chamber 12c. The gas delivery portion 30 configures an upper electrode. The gas delivery portion 30 is provided above the stage 16 through a space within the chamber 12c. The gas delivery portion 30 is supported by an upper portion of the chamber body 12 through a member 32. The member 32 may have insulation properties.

The gas delivery portion 30 has a shower plate 34 and a support member 36. The shower plate 34 is provided above the stage 16. A bottom surface of the shower plate 34 faces the chamber 12c. The shower plate 34 may be formed of, for example, silicon or silicon oxide. Alternatively, the shower plate 34 may be formed by coating a conductive basic material (for example, aluminum) with ceramics.

A plurality of gas delivery outlets 35 is formed in the shower plate 34. The plurality of gas delivery outlets 35 penetrates the shower plate 34 in a thickness direction of the shower plate 34. In one embodiment, the plurality of gas delivery outlets 35 configures a plurality of gas delivery outlet groups Ga, Gb, and Gc. That is, some gas delivery outlets among the plurality of gas delivery outlets 35 configures the gas delivery outlet group Ga, other gas delivery outlets of the plurality of gas delivery outlets 35 configures the gas delivery outlet group Gb, and still other gas delivery outlets of the plurality of gas delivery outlets 35 configures the gas delivery outlet group Gc. The number of gas delivery outlet groups may be an arbitrary number.

The gas delivery outlets 35 of the gas delivery outlet group Ga, the gas delivery outlets 35 of the gas delivery outlet group Gb, and the gas delivery outlets 35 of the gas delivery outlet group Gc are respectively formed in a plurality of regions of the shower plate 34 which extend coaxially around the axis AX. Specifically, the gas delivery outlets 35 of the gas delivery outlet group Ga are formed in a region crossing the axis AX. The gas delivery outlets 35 of the gas delivery outlet group Gb are formed in a region outside the region in which the gas delivery outlets 35 of the gas delivery outlet group Ga are formed. The gas delivery outlets 35 of the gas delivery outlet group Ge are formed in a region outside the region in which the gas delivery outlets 35 of the gas delivery outlet group Gb are formed.

The support member 36 is configured to detachably support the shower plate 34. The support member 36 is formed of, for example, a conductive material such as aluminum. A plurality of gas diffusion spaces 36a, 36b, and 36c are formed in the support member 36. The plurality of gas diffusion spaces 36a, 36b, and 36c are provided coaxially around the axis AX, and are separated from one another. The gas diffusion space 36a is formed in a region crossing the axis AX. The gas diffusion space 36b is formed to extend in a circumferential direction around the axis AX outside the gas diffusion space 36. The gas diffusion space 36c is formed to extend in the circumferential direction around the axis AX outside the gas diffusion space 36b. The number of gas diffusion spaces may be equal to the number of gas delivery outlet groups.

A plurality of holes are formed in the support member 36. The plurality of holes extend downwards from the gas diffusion spaces 36a, 36b, and 36c and are communicatively connected to the plurality of gas delivery outlets 35, respectively. Accordingly, the gas delivery outlets 35 of the gas delivery outlet group Ga are connected to the gas diffusion space 36a, the gas delivery outlets 35 of the gas delivery outlet group Gb are connected to the gas diffusion space 36b, and the gas delivery outlets 35 of the gas delivery outlet group Gc are connected to the gas diffusion space 36c.

In the plasma processing apparatus 10, a shield 40 is detachably provided along an inner wall of the chamber body 12. The shield 40 is also provided on a circumference of the support 14. The shield 40 prevents by-products in the plasma processing from adhering to the chamber body 12. For example, the shield 40 may be formed by coating an aluminum material with ceramics such as $Y_2O_3$.

A baffle plate 42 is provided in a bottom side of the chamber body 12 and between the support 14 and the sidewall of the chamber body 12. For example, the baffle plate 42 may be formed by coating an aluminum material with ceramics such as $Y_2O_3$. A plurality of through-holes is formed in the baffle plate 42. An exhaust port 12e is formed under the baffle plate 42 in the chamber body 12. An exhaust device 46 is connected to the exhaust port 12e via the exhaust pipe 44. The exhaust device 46 may have a pressure control valve. In addition, the exhaust device 46 may have a turbo molecular pump and/or a dry pump.

The plasma processing apparatus 10 further includes a first radio-frequency power supply 51 and a second radio-frequency power supply 52. The first radio-frequency power supply 51 is a power supply that generates a first radio-frequency wave for plasma generation. For example, a frequency of the first radio-frequency wave is a frequency in a range of 27 to 100 MHz. The first radio-frequency power supply 51 is connected to the lower electrode 18 through a matching unit 53. The matching unit 53 has a circuit for matching an output impedance of the first radio-frequency power supply 51 and an impedance of a load side (lower electrode 18). The first radio-frequency power supply 51 may be connected to the upper electrode through the matching unit 53.

The second radio-frequency power supply 52 is a power supply that generates a second radio-frequency wave for attracting ions to the substrate W, that is, a radio-frequency wave for bias. For example, a frequency of the second radio-frequency wave is a frequency in a range of 400 kHz to 13.56 MHz. The second radio-frequency power supply 52 is connected to the lower electrode 18 through a matching unit 54. The matching unit 54 has a circuit for matching an output impedance of the second radio-frequency power supply 52 and the impedance of the load side (lower electrode 18).

The plasma processing apparatus 10 further includes a gas supply system GS. The gas supply system GS has a gas supply unit GU1 (first gas supply unit). The gas supply system GS may further have a gas supply unit GU2 (second gas supply unit) and a flow splitter FS.

The gas supply unit GU1 has a vaporizer VZ, a primary valve VA21 (first primary valve), a flow rate controller FA2 (first flow rate controller), a secondary valve VA22 (first secondary valve), and a pipe PA. The gas supply unit GU1 may further include a primary valve VA11 and a secondary valve VA12.

The pipe PA provides a gas supply line L1 (first gas supply line). The gas supply line L1 is connected to the chamber 12c. In one embodiment, the gas supply line L1 is connected to the chamber 12c through a gas supply line L23 (second gas supply line) to be described below. A gas from the gas supply line L1 is delivered to the chamber 12c through the gas supply line L23, the gas diffusion space 36c, and the plurality of gas delivery outlets 35 of the gas delivery outlet group Gc. The gas supply line L1 may be connected to any one of a plurality of gas supply lines through which a gas is supplied to the chamber 12c from the flow splitter to be described below.

The vaporizer VZ is connected to a liquid source SA1 through the primary valve VA11. The vaporizer VZ generates a first processing gas by vaporizing a liquid supplied from the liquid source SA1. The vaporizer VZ controls a flow rate of the first processing gas. The vaporizer VZ may have a heating device for vaporizing the liquid and a flow rate controller that adjusts the flow rate of the first processing gas. The flow rate controller of the vaporizer VZ is, for example, a mass flow controller. The vaporizer VZ is connected to the gas supply line L1 through the secondary valve VA12. The first processing gas generated by the vaporizer VZ is a gas deposited on the substrate W. In a case where a silicon-based material is deposited on the substrate W, the first processing gas may be, for example, an aminosilane-based gas. In a case where the substrate W has a porous film and pores in the porous film are filled with the liquid, the first processing gas is a gas to be liquefied through capillary condensation, for example, a fluorocarbon-based gas, a hydrocarbon gas, or a gas including alcohol such as isopropyl alcohol.

The flow rate controller FA2 is connected to a gas source SA2 through the primary valve VA21. The gas source SA2 is a source of a first inert gas. The first inert gas is a nitrogen gas or a rare gas. The flow rate controller FA2 is connected to the gas supply line L1 through the secondary valve VA22.

Figure 4:
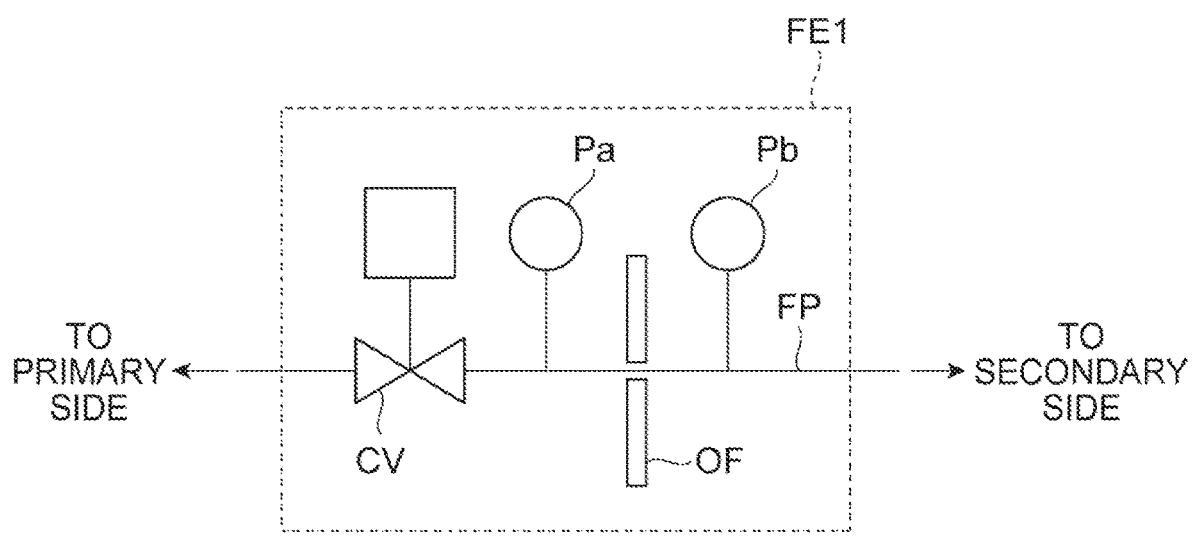
FIG. 4 illustrates an example of a configuration of a flow rate controller.
Figure 5:
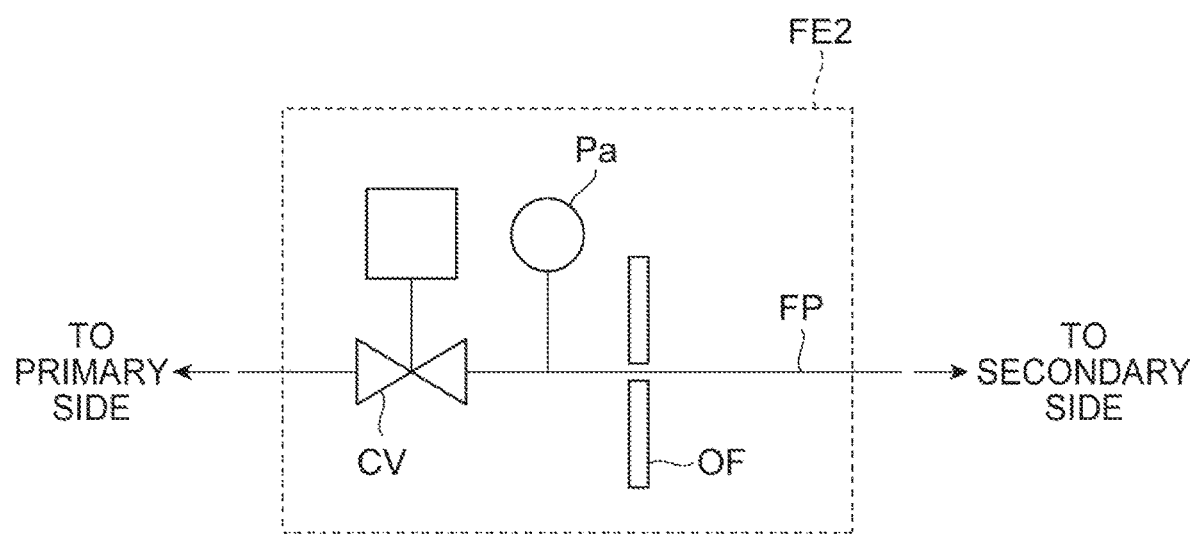
FIG. 5 illustrates another example of a configuration of a flow rate controller.

FIG. 4 illustrates an example of a configuration of a flow rate controller. FIG. 5 illustrates another example of a configuration of a flow rate controller. A flow rate controller FE1 shown in FIG. 4 or a flow rate controller FE2 shown in FIG. 5 may be used as the flow rate controller FA2 and a pressure-control-type flow rate controller in the plasma processing apparatus 10.

As shown in FIG. 4, the flow rate controller FE1 has a control valve CV, an orifice member OF, a pressure sensor Pa, and a pressure sensor Pb. The control valve CV provides a part of a flow passage FP within the flow rate controller FE1. The control valve CV adjusts a flow rate of the gas flowing downstream by adjusting an opening degree thereof. The orifice member OF provides an orifice on the downstream side of the control valve CV. The orifice reduces a sectional area of the flow passage FP. The pressure sensor Pa is configured to obtain a measurement value of a pressure of a part of the flow passage FP, that is, a flow passage between the orifice member OF and the control valve CV. The pressure sensor Pb is configured to obtain a measurement value of a pressure of another part of the flow passage FP, that is, a flow passage on the secondary side of the orifice member OF.

In the flow rate controller FE1, in a case where a pressure of the flow passage FP on the upstream side (primary side) of the orifice is not less than twice a pressure of the flow passage FP on the downstream side (secondary side) of the orifice, the opening degree of the control valve CV is controlled to decrease a difference between a set flow rate and a flow rate determined from the measurement value of the pressure obtained by the pressure sensor Pa. In the flow rate controller FE1, in a case where the pressure of the flow passage FP on the upstream side of the orifice is less than twice the pressure of the flow passage FP on the downstream side of the orifice, the opening degree of the control valve CV is controlled to decrease a difference between the set flow rate and a flow rate determined from a difference between the measurement value of the pressure obtained by the pressure sensor Pa and the measurement value of the pressure obtained by the pressure sensor Pb.

As shown in FIG. 5, the flow rate controller FE2 is different from the flow rate controller FE1 in that the flow rate controller FE2 does not have the pressure sensor Pb. The flow rate controller FE2 is used on the assumption that the pressure of the flow passage FP on the upstream side of the orifice is not less than twice the pressure of the flow passage FP on the downstream side of the orifice. In the flow rate controller FE2, the opening degree of the control valve CV is controlled to decrease the difference between the set flow rate and a flow rate determined from the measurement value of the pressure obtained by the pressure sensor Pa.

Referring to FIG. 3 again, in one embodiment, the shortest length of the flow passage between each of the plurality of gas delivery outlets through which the first processing gas is delivered to the chamber 12c and each of one or two first pressure sensors of the flow rate controller FA2 is equal to or less than 1.5 m. In the example shown in FIG. 3, the plurality of gas delivery outlets through which the first processing gas is delivered is the plurality of gas delivery outlets 35 of the gas delivery outlet group Gc. The one or two first pressure sensors are the pressure sensor Pa, the pressure sensor Pb of the flow rate controller FA2, or both of the pressure sensor Pa and the pressure sensor Pb. Open ends of the plurality of gas delivery outlets 35 of the gas delivery outlet group a are open ends facing the chamber 12c.

In one embodiment, a heater HT is attached to the pipe constituting the gas supply line from the secondary valve VA12 to the gas delivery portion 30. The heater HT heats the pipe, and suppresses the liquefaction of the first processing gas within the pipe.

The gas supply unit GU2 is configured to supply the second processing gas and a second inert gas. For example, the second processing gas is a processing gas for etching a film of the substrate W, and includes, for example, a fluorocarbon-based gas. The second inert gas is a nitrogen gas or a rare gas.

In one embodiment, the gas supply unit GU2 has a primary valve VB11, a flow rate controller FB1, a secondary valve VB12, a primary valve VB21, a flow rate controller FB2, and a secondary valve VB22. The flow rate controller FE1, the flow rate controller FE2, or the mass flow controller may be used as the flow rate controller FB1. The flow rate controller FB1 is connected to a gas source SB1 through the primary valve VB11. The gas source SB1 is a source of the second processing gas. The flow rate controller FB1 is connected to a gas supply line L2 through the secondary valve VB12.

The flow rate controller FE1, the flow rate controller FE2, or the mass flow controller may be used as the flow rate controller FB2. The flow rate controller FB2 is connected to the gas source SB2 through the primary valve VB21. The gas source SB2 is a source of the second inert gas. The flow rate controller FB2 is connected to the gas supply line L2 through the secondary valve VB22. The gas supply line L2 is connected to an input of the flow splitter FS on the downstream side.

The flow splitter FS has a plurality of outputs, and a plurality of gas supply lines L21, L22, and L23 is connected to the plurality of outputs. The plurality of gas supply lines L21, L22, and L23 is provided by a plurality of pipes P21, P22, and P23. The number of outputs of the flow splitter FS is equal to the number of gas delivery outlet groups. The flow splitter FS is configured to distribute the gas supplied to the input thereof to the plurality of gas supply lines L21, L22, and L23.

A common gas line 73 extends from the input within the flow splitter FS. The gas line 73 is branched to a plurality of gas lines 74a, 74b, and 74c. The plurality of gas lines 74a, 74b, and 74c is connected to the plurality of gas supply lines L21, L22, and L23. The plurality of gas supply lines L21, L22, and L23 is connected to the plurality of gas delivery outlet groups Ga, Gb, and Gc through the gas diffusion spaces 36a, 36b, and 36c, respectively.

A primary valve 76a, a flow rate controller 75a, and a secondary valve 77a are provided on the gas line 74a. A primary valve 76b, a flow rate controller 75b, and a secondary valve 77b are provided on the gas line 74b. A primary valve 76c, a flow rate controller 75c, and a secondary valve 77c are provided on the gas line 74c. The flow rate controller 75a, the flow rate controller 75b, and the flow rate controller 75c may be mass flow controllers, respectively.

In one embodiment, a flow rate controller FC (second flow rate controller) is connected to a gas supply line L21 (third gas supply line) through a secondary valve VC2 (second secondary valve). The flow rate controller FE1 or the flow rate controller FE2 may be used as the flow rate controller FC. The flow rate controller FC is connected to a gas source SC through a primary valve VC1 (second primary valve). The flow rate controller FC may be connected to any gas supply line of the plurality of gas supply lines L21, L22, and L23 as long as a gas supply line is different from the gas supply line to which the gas supply line L1 is connected.

In one embodiment, the shortest length of the flow passage between each of the open ends of the plurality of gas delivery outlets 35 (in one example, the plurality of gas delivery outlets 35 of the gas delivery outlet group Ga) connected to the flow rate controller FC through the gas supply line L21 and each of one or two second pressure sensors of the flow rate controller FC is equal to or less than 1.5 m. The one or two second pressure sensors of the flow rate controller FC are the pressure sensor Pa or the pressure sensor Pb of the flow rate controller FC or both of the pressure sensor Pa and the pressure sensor Pb. The open ends of the plurality of gas delivery outlets 35 of the gas delivery outlet group Ga are open ends facing the chamber 12c.

In one embodiment, the plasma processing apparatus 10 further includes a controller Cnt. The controller Cnt is a computer that includes a processor, a storage device, an input device, and a display device. The controller Cnt controls the units of the plasma processing apparatus 10 in order to perform the plasma processing performed by the plasma processing apparatus 10. The controller Cnt may control the units of the plasma processing apparatus 10 in the performing of the method MT, and may perform an arithmetic operation to be described below in the method MT.

Figure 6:
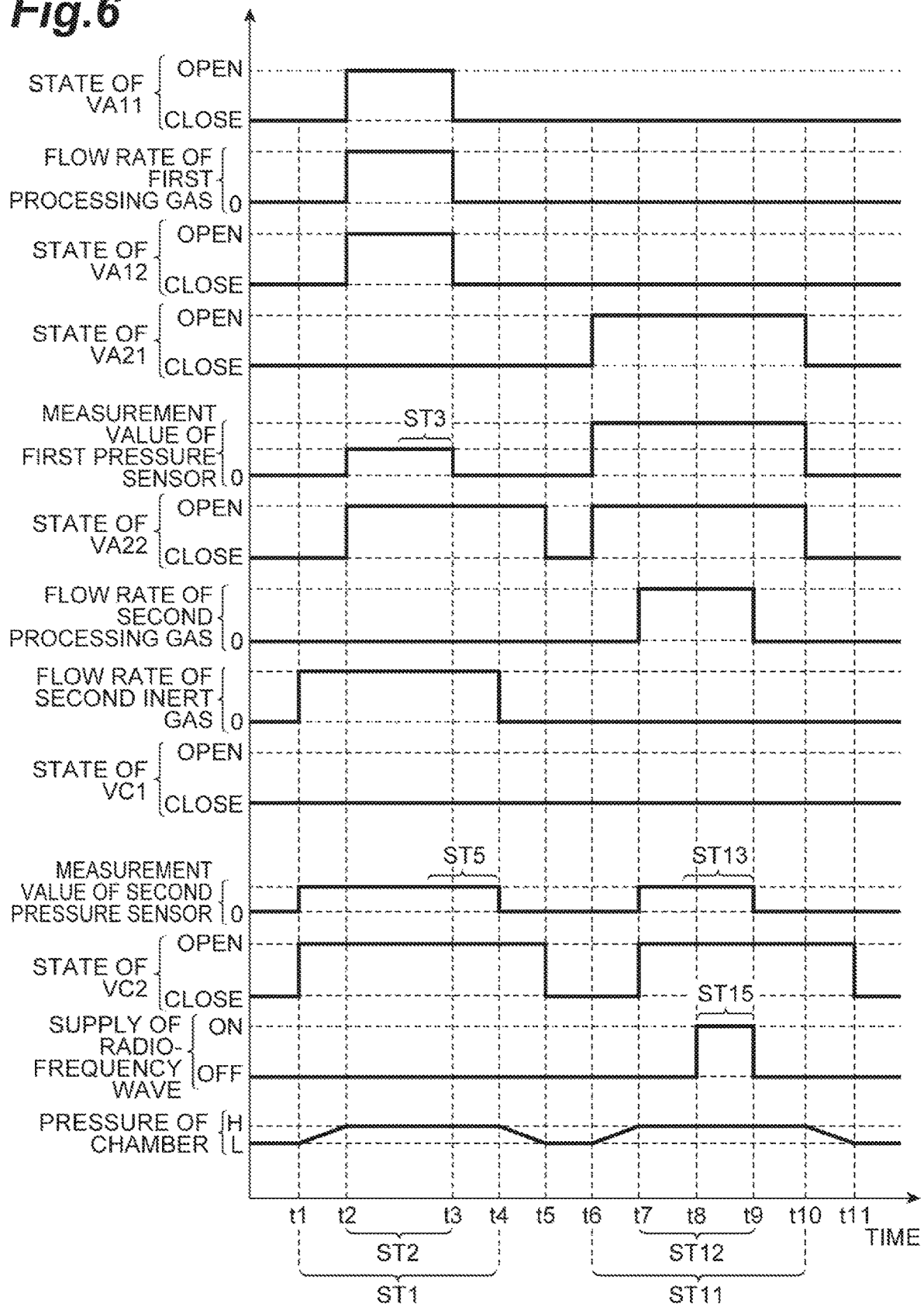
FIG. 6 is an exemplary timing chart related to the method shown in FIGS. 1 and 2.

The method MT will be described by referring to FIGS. 1 and 2 again. The following description also refers to FIG. 6. FIG. 6 is an exemplary timing chart related to the method shown in FIGS. 1 and 2. In the timing chart of FIG. 6, a horizontal axis depicts a time. In the timing chart of FIG. 6, a vertical axis depicts an opened or closed state of the primary valve VAN., a flow rate of the first processing gas, an opened or closed state of the secondary valve VA12, an opened or closed state of the primary valve VA21, a measurement value of the first pressure sensor (the pressure sensor Pa or the pressure sensor Pb of the flow rate controller FA2, or both thereof), an opened or closed state of the secondary valve VA22, a flow rate of the second processing gas, a flow rate of the second inert gas, an opened or closed state of the primary valve VC1, a measurement value of the second pressure sensor (the pressure sensor Pa or the pressure sensor Pb of the flow rate controller FC or both thereof), an opened or closed state of the secondary valve VC2, a supply state of a radio-frequency wave (first radio-frequency wave, a second radio-frequency wave, or both thereof), and a pressure of the chamber 12c.

The method MT is performed in a state in which the substrate W is mounted on the stage 16. The method MT starts with step ST1. Step ST1 is started at time t1 in the timing chart of FIG. 6. In step ST1, the supply of the second inert gas from the gas supply unit GU2 is started. In step ST1, the primary valve VB11 and the secondary valve VB12 are closed, and the primary valve VB21 and the secondary valve VB22 are opened. The primary valve 76a, the secondary valve 77a, the primary valve 76b, the secondary valve 77b, the primary valve 76c, and the secondary valve 77c are opened. The primary valve VC1 is closed, and the secondary valve VC2 is opened. In step ST1, the exhaust device 46 is operated such that the pressure of the chamber 12c is set to a predetermined pressure. By performing step ST1, the second inert gas is supplied to the chamber 12c through the gas supply lines L21, L22, and L23. The primary valve VA11, the secondary valve VA12, the primary valve VA21, and the secondary valve VA22 of the gas supply unit GU1 are closed during a time period between a start time of step ST1 and a start time (t2 in FIG. 6) of subsequent step ST2.

Step ST2 is performed while step ST1 is performed. In step ST2, the first processing gas is supplied to the chamber 12c from the vaporizer VZ through the gas supply line L1 and the gas supply line L23. In step ST2, the primary valve VA11, the secondary valve VA12, and the secondary valve VA22 are opened. The closed state of the primary valve VA21 is maintained. In step ST2, the exhaust device 46 is operated such that the pressure of the chamber 12c is set to a predetermined pressure.

Step ST3 is performed while step ST2 is performed. In step ST3, the measurement value of the pressure of the flow passage of the flow rate controller FA2 is obtained by the one or two first pressure sensors (the pressure sensor Pa, the pressure sensor Pb, or both thereof) of the flow rate controller FA2, and a time-average value of the measurement value is determined. In step ST3, the time-average value is determined by using the measurement value of the one or two first pressure sensors of the flow rate controller FA2 obtained in a state in which the pressure of the flow passage within the flow rate controller FA2 is stable. For example, it is determined that the pressure of the flow passage within the flow rate controller FA2 is stable in a case where a variation amount of the measurement value of the one or two first pressure sensors of the flow rate controller FA2 is equal to or less than a threshold value.

In step ST4, the time-average value determined in step ST3 is compared with a predetermined value. The predetermined value is a time-average value determined similarly to the time-average value obtained in step ST3 in a state in which a sectional area of the gas supply line of the gas supply system GS is not decreased. In step ST4, in a case where the time-average value is greater than the predetermined value, it can be detected that a solid is generated due to the reaction of the first processing gas and the sectional area of the gas supply line L1 is decreased.

Step ST5 is performed while step ST1 is performed. In step ST5, the measurement value of the pressure of the flow passage of the flow rate controller FC is obtained by the one or two second pressure sensors (the pressure sensor Pa, the pressure sensor Pb, or both thereof) of the flow rate controller FC, and the time-average value of the measurement value is determined. In step ST5, the time-average value is determined by using the measurement value of the one or two second pressure sensors of the flow rate controller FC obtained in a state in which the pressure of the flow passage within the flow rate controller FC is stable. For example, it is determined that the pressure of the flow passage within the flow rate controller FC is stablein a case where a variation amount of the measurement value of the one or two second pressure sensors of the flow rate controller FC is equal to or less than a threshold value.

In step ST6, the time-average value determined in step ST5 is compared with a predetermined value. The predetermined value is different from the predetermined value used in step ST4. The predetermined value is a time-average value obtained similarly to the time-average value obtained in step ST5 in a state in which a sectional area of the gas supply line of the gas supply system GS is not decreased. The time-average value obtained in step ST5 reflects a change in the sectional area of the gas supply line L21. Accordingly, it is possible to inspect the gas supply line L21 by performing step ST6.

In subsequent step ST7, the supply of the first processing gas is stopped. Step ST7 is started at time t3 in the timing chart of FIG. 6. In step ST7, the primary valve VA11 and the secondary valve VA12 are closed.

In subsequent step ST8, the supply of the second inert gas is stopped. Step ST8 is started at time t4 in the timing chart of FIG. 6. In step ST8, the primary valve VB21 and the secondary valve VB22 are closed. The inert gas is supplied to the gas supply lines L21, L22, and L23 from the gas supply unit GU2 while the first processing gas is supplied to the chamber in step ST3. Accordingly, the first processing gas is prevented from flowing to the flow splitter FS.

Step ST9 is started at time t4 in the timing chart of FIG. 6. In step ST9, the chamber 12c, the flow passage from the chamber 12c to the primary valve VA21, the flow passage from the chamber 12c to the primary valve VC1, the flow passage from the chamber 12c to the secondary valve VB12, and the flow passage from the chamber 12c to the secondary valve VB22 are exhausted by the exhaust device 46. Subsequent step ST10 is started at time t5 in the timing chart of FIG. 6. In step ST10, the secondary valve VA22 and the secondary valve VC2 are closed.

Subsequent step ST11 is performed in a state in which the supply of the first processing gas to the gas supply line L1 is stopped. Step ST11 is started at time t6 in the timing chart of FIG. 6. In step ST11, the supply of the first inert gas from the gas supply unit GU1 is started. In step ST11, the primary valve VA21 and the secondary valve VA22 are opened. In step ST11, the exhaust device 46 is operated such that the pressure of the chamber 12c is set to a predetermined pressure.

Step ST12 is performed while step ST11 is performed. Step ST12 is started at time t7 in the timing chart of FIG. 6. In step ST12, the second processing gas is supplied to the chamber 12c from the gas supply unit GU2 through the flow splitter FS and the plurality of gas supply lines L21, L22, and L23. In step ST12, the exhaust device 46 is operated such that the pressure of the chamber 12c is set to a predetermined pressure. In step ST12, the secondary valve VC2 is opened. Since step ST12 is performed while step ST11 is performed, in a case where the second processing gas is supplied to the chamber 12c, the second processing gas is prevented from flowing to the gas supply line L1.

Step ST13 is performed while step ST12 is performed. In step ST13, the measurement value of the pressure of the flow passage of the flow rate controller FC is obtained by the one or two second pressure sensors of the flow rate controller FC, and the time-average value of the measurement value is determined. In step ST13, the time-average value is determined by using the measurement value of the one or two second pressure sensors of the flow rate controller FC obtained in a state in which the pressure of the flow passage within the flow rate controller FC is stable. For example, it is determined that the pressure of the flow passage within the flow rate controller FC is stable in a case where a variation amount of the measurement value of the one or two second pressure sensors of the flow rate controller FC is equal to or less than a threshold value.

In step ST14, the time-average value determined in step ST13 is compared with a predetermined value. The predetermined value may be different from the predetermined value used in step ST4 and the predetermined value used in step ST6. The predetermined value is a time-average value obtained similarly to the time-average value obtained in step ST13 in a state in which a sectional area of the gas supply line of the gas supply system GS is not decreased. The time-average value determined in step ST13 reflects a change in the sectional area of the gas supply line L21. Accordingly, it is possible to inspect the gas supply line L21 by performing step ST14.

Step ST15 is performed while step ST12 is performed. Step ST15 is started at time t8 in the timing chart of FIG. 6. In step ST15, the first radio-frequency wave, the second radio-frequency wave, or both of the first radio-frequency wave and the second radio-frequency wave are supplied. Accordingly, a plasma of the second processing gas is generated within the chamber 12c. In step ST2, particles of the first processing gas are deposited on the substrate W and/or within the substrate W. In step ST15, the substrate W is etched by radicals and/or ions from the plasma. That is, in the method MT, the gas supply system GS is inspected while a process including the depositing of the particles composing the first processing gas on the substrate W and/or within the substrate W and the etching of the substrate W is performed. In one embodiment, step ST2 and step ST12 are alternately performed as shown in FIGS. 1 and 2. Step ST15 is performed while step ST12 is performed. That is, the depositing of the particles composing the first processing gas on the substrate W and/or within the substrate W and the etching of the substrate W are alternately performed.

Subsequent step ST16 is started at time t9 in the timing chart of FIG. 6. In step ST16, the supply of the second processing gas is stopped. In step ST16, the primary valve VB11 and the secondary valve VB12 are closed. In step ST16, the supply of the radio-frequency wave is stopped.

Subsequent step ST17 is started at time t10 in the timing chart of FIG. 6. In step ST17, the supply of the first inert gas is stopped. In step S17, the primary valve VA21 and the secondary valve VA22 are closed. Subsequent step ST18 is started at time t10 in the timing chart of FIG. 6. In step ST18, the chamber 12c is exhausted by the exhaust device 46. Subsequent step ST19 is started at time t11 in the timing chart of FIG. 6. In step ST19, the secondary valve VC2 is closed.

In subsequent step ST20, it is determined whether or not a stop condition is satisfied. It is determined that the stop condition is satisfied in a case where the number of times of a sequence including a plurality of steps starting with step ST1 reaches a predetermined number of times. In a case where it is determined that the stop condition is not satisfied in step ST20, the processing from step ST1 is repeated. Meanwhile, in a case where it is determined that the stop condition is satisfied in step S20, the method MT is ended.

As described above, in step ST2, the first processing gas is supplied to the chamber 12c from the vaporizer VZ. The first processing gas is also supplied to the flow passage FP within the flow rate controller FA2. In the flow rate controller FA2, the measurement value of the pressure of the flow passage FP is obtained by the one or two first pressure sensors, that is, the pressure sensor Pa or the pressure sensor Pb of the flow rate controller FA2, or both of the pressure sensor Pa and the pressure sensor Pb. In step ST5, the time-average value of the measurement value is determined. In a case where the solid is generated due to the reaction of the first processing gas within the gas supply line L1, the sectional area of the gas supply line L1 is decreased, and the time-average value of the measurement value of the pressure of the flow passage FP within the flow rate controller FA2 is increased. That is, the time-average value reflects a change in the sectional area of the gas supply line L1 which is caused by the reaction of the first processing gas. According to the method MT, since such a time-average value is determined, it is possible to inspect the gas supply system GS for a state of the gas supply line L1. According to the method MT, it is possible to detect the liquefaction of the first processing gas within the gas supply line L1 which is caused by the failure of the heater HT.

In the one embodiment, the shortest length of the flow passage between each of the open ends of the plurality of gas delivery outlets through which the first processing gas is delivered to the chamber 12c, that is, the plurality of gas delivery outlets 35 of the gas delivery outlet group Gc and each of one or two first pressure sensors of the flow rate controller FA2 is equal to or less than 1.5 m, as mentioned above. According to the embodiment, it is possible to detect a change in the pressure caused by the reduction of the sectional area of the gas supply line L1 with high sensitivity by using the one or two first pressure sensors.

In step ST4 of the one embodiment, the time-average value of the measurement values of the two first pressure sensors of the flow rate controller FA2, that is, the measurement value of the pressure sensor Pa and the measurement value of the pressure sensor Pb is obtained. According to the embodiment, it is possible to obtain a value that reflects a change in the sectional area of the gas supply line L1 with high accuracy.

In step ST5 and step ST13 of the one embodiment, the time-average value of the measurement values of the two second pressure sensors of the flow rate controller FC, that is, the measurement value of the pressure sensor Pa and the measurement value of the pressure sensor Pb is obtained. According to the embodiment, it is possible to obtain a value that reflects a change in the sectional area of the gas supply line L21 with high accuracy.

Hereinbefore, various embodiments are described. However, various modifications may be made without being limited to the above-described embodiments. For example, the idea of the method MT related to the inspection of the reduction of the sectional area of the gas supply line which is caused by the generation of the solid due to the reaction of the first processing gas may be applied to any substrate processing apparatus including a gas supply system having a vaporizer. The method MT is not limited to be used for capacitively coupled plasma processing apparatus, and may be used for inspecting a gas supply system of any plasma processing apparatus such as an inductively coupled plasma processing apparatus or a plasma processing apparatus using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of inspecting a gas supply system of a substrate processing apparatus, the method comprising:
    providing the substrate processing apparatus which includes:
        a chamber body providing a chamber;
        the gas supply system configured to supply a gas to the chamber; and
        an exhaust device connected to the chamber,
    the gas supply system having a first gas supply unit,
    the first gas supply unit including:
        a pipe providing a first gas supply line connected to the chamber;
        a vaporizer configured to generate a first processing gas by vaporizing a liquid, and connected to the first gas supply line;
        a first primary valve;
        a first secondary valve; and
        a first flow rate controller connected to a source of a first inert gas through the first primary valve, and connected to the first gas supply line through the first secondary valve, and
    the first flow rate controller having one or two first pressure sensors configured to obtain a measurement value of a pressure of a flow passage within the first flow rate controller,
    supplying the first processing gas to the chamber from the vaporizer through the first gas supply line in a state in which the first primary valve is closed, the first secondary valve is opened, and the exhaust device is operated to set a pressure of the chamber to a predetermined pressure; and
    determining a time-average value of the measurement value obtained by the one or two first pressure sensors while said supplying the first processing gas is performed.

2. The method of inspecting a gas supply system according to claim 1, further comprising:
    comparing the time-average value with a predetermined value.

3. The method of inspecting a gas supply system according to claim 1,
    wherein a shortest length of a flow passage between each of open ends of a plurality of gas delivery outlets through which the first processing gas is delivered to the chamber and each of the one or two first pressure sensors is equal to or less than 1.5 m.

4. The method of inspecting a gas supply system according to claim 1,
    wherein the first flow rate controller further has a first control valve and a first orifice member, and has two first pressure sensors as the one or two first pressure sensors,
    one of the two first pressure sensors is configured to obtain a measurement value of a pressure of a flow passage between the first control valve and the first orifice member, and
    an other one of the two first pressure sensors is configured to obtain a measurement value of a pressure of a flow passage on a secondary side of the first orifice member.

5. The method of inspecting a gas supply system according to claim 1,
    wherein the substrate processing apparatus further includes:
        a second gas supply unit configured to supply a second processing gas and a second inert gas;
        a plurality of pipes respectively provides a plurality of gas supply lines connected to the chamber, the plurality of gas supply lines including a second gas supply line and a third gas supply line; and
        a flow splitter configured to distribute a gas supplied from the second gas supply unit to the plurality of gas supply lines,
    the first gas supply line is connected to the chamber through the second gas supply line,
    the method further comprises supplying the second inert gas to the plurality of gas supply lines from the second gas supply unit through the flow splitter, and
    said supplying the first processing gas is performed while said supplying the second inert gas is performed.

6. The method of inspecting a gas supply system according to claim 5, further comprising:
    supplying the first inert gas to the first gas supply line in a state in which supply of the first processing gas to the first gas supply line from the vaporizer is stopped; and
    supplying the second processing gas to the chamber from the second gas supply unit through the flow splitter and the plurality of gas supply lines while said supplying the first inert gas is performed.

7. The method of inspecting a gas supply system according to claim 6,
wherein the substrate processing apparatus is a plasma processing apparatus,
the method is performed in a state in which a substrate is mounted on a stage provided within the chamber,
particles of the first processing gas are deposited on the substrate and/or within the substrate in said supplying the first processing gas, and
a plasma of the second processing gas is generated within the chamber to etch the substrate while said supplying the second processing gas is performed.

8. The method of inspecting a gas supply system according to claim 6,
wherein said supplying the first processing gas and said supplying the second processing gas are alternately performed.

9. The method of inspecting a gas supply system according to claim 6,
wherein the substrate processing apparatus further includes a second flow rate controller, a second primary valve provided on a primary side of the second flow rate controller, and a second secondary valve provided on a secondary side of the second flow rate controller,
the second flow rate controller has one or two second pressure sensors configured to obtain a measurement value of a pressure of a flow passage within the second flow rate controller, and is connected to the third gas supply line through the second secondary valve, and
the method further comprises determining a time-average value of the measurement value obtained by the one or two second pressure sensors in a state in which the second primary valve is closed and the second secondary valve is opened while said supplying the second inert gas is performed.

10. The method of inspecting a gas supply system according to claim 9, further comprising:
obtaining a time-average value of the measurement value obtained by the one or two second pressure sensors in a state in which the second primary valve is closed and the second secondary valve is opened while said supplying the second processing gas is performed.

11. The method of inspecting a gas supply system according to claim 9,
wherein the second flow rate controller further has a second control valve and a second orifice member, and has two second pressure sensors as the one or two second pressure sensors,
one of the two second pressure sensors is configured to obtain a measurement value of a pressure of a flow passage between the second control valve and the second orifice member, and
an other one of the two second pressure sensors is configured to obtain a measurement value of a pressure of a flow passage on a secondary side of the second orifice member.

* * * * *